United States Patent [19]
Osaki et al.

[11] Patent Number: 5,568,070
[45] Date of Patent: Oct. 22, 1996

[54] MULTIPLEXER W/ SELECTIVE SWITCHING FOR EXTERNAL SIGNALS

[75] Inventors: Akitoshi Osaki; Hideo Matsui, both of Itami, Japan

[73] Assignee: Mitsubishi Denki Kabushiki Kaisha, Tokyo, Japan

[21] Appl. No.: 519,335

[22] Filed: Aug. 25, 1995

[30]     Foreign Application Priority Data

Dec. 8, 1994   [JP]   Japan ..................................... 6-305192

[51] Int. Cl.⁶ ............................................. H03K 119/173
[52] U.S. Cl. .............................. 326/113; 326/38; 327/99; 327/408
[58] Field of Search ............................... 326/113, 37, 38; 327/403, 407.8, 99; 307/113, 115

[56]         References Cited

U.S. PATENT DOCUMENTS 5,034,818   7/1991   Baik-Hee ................................ 327/403
5,336,945   8/1994   Ikeda ........................................ 327/99
5,463,327  10/1995   Hastie ...................................... 326/37

Primary Examiner—Edward P. Westin
Assistant Examiner—Andrew Sanders
Attorney, Agent, or Firm—Lowe, Price, LeBlanc & Becker

[57]          ABSTRACT

A multiplexer includes three switching divisions each of which has one terminal connected to each of the signal terminals and the other terminal connected to a fourth switching division. A signal inputted through the selected signal terminal is outputted from the other signal terminal to the exterior by operating the fourth switching division.

8 Claims, 10 Drawing Sheets

MULTIPLEXER W/ SELECTIVE SWITCHING FOR EXTERNAL SIGNALS

BACKGROUND OF THE INVENTION

1. Field of the invention

The present invention relates to a multiplexer, and more particularly to a multiplexer which can select an signal terminal or terminals to which a signal is to be inputted.

2. Description of Prior Art

In general, a single-chip microcomputer is equipped with a number of input terminals for receiving signals and a built-in multiplexer for alternatively selecting one of the input terminals. The signal at a selected signal input terminal is inputted to an internal circuit.

The known single-chip microcomputer will be described by reference to FIG. 1, which is a circuit diagram thereof:

The single-chip microcomputer M is provided with signal input terminals $AN_0$, $AN_1$ . . . $AN_{n-2}$ and $AN_{n-1}$ each of which is respectively connected to one terminals of switching elements $S_0$ to $S_{n-1}$. The other terminals thereof are connected to an analog/digital converter (A/D converter) 1 at one point as shown in FIG. 1. In this way the switching elements $S_0$ to $S_{n-1}$ constitute a multiplexer.

The A/D converter 1 converts an analog signal at any one of the input terminals $AN_0$ to $AN_{n-1}$ which is selected by turning on or off the switching elements $S_0$ to $S_{n-1}$. The A/D converter 1 performs in a high accuracy A/D conversion upon the input signal having an optimum potential amplitude predetermined by a source voltage and other factors.

In FIG. 1, in a case where an analog signal to be converted into digital signal (hereinafter referred to as "target analog signal") is inputted to any one of the terminals $AN_0$ to $AN_{n-1}$ in the microcomputer M. If each of the target analog signals inputted to input terminals $AN_1$ and $AN_{n-2}$ has a smaller than the optimum potential amplitude, the smaller is amplified to have an optimum value by means of analog amplifiers 51 and 52 connected to the input terminals $AN_1$ and $AN_{n-2}$ as external circuit elements, by inputting analog signals thereto, as shown in FIG. 2. The analog amplifiers 51 and 52 are installed at the expense of the users. In this way all analog signals inputted to the input terminals $AN_0$, $AN_1$ . . . $AN_{n-2}$ and $AN_{n-1}$ can be inputted to the analog/digital converter 1 in an optimum potential amplitude.

The addition of the extra analog amplifiers to each of the input terminals increases the production cost. In addition, the amplitude of each analog amplifier must be precisely adjusted so as to have an optimum in accordance with the amplitude of the analog signal. This precise adjustment is costly. Users of single-chip microcomputers have to bear all expenses involved in equipping the analog amplifiers and adjusting the amplitude thereof.

In order to save the costs on the adjustment of amplitude of the analog amplifiers added by users, there is a proposal for an arrangement shown in FIG. 3 which includes an analog amplifier 5 connected to the input terminal $AN_1$ alone, and a multiplexer 11 which is externally connected to the analog amplifier 5, selects an analog signal having a relatively small amplitude and inputs it to the analog amplifier 5.

This proposed arrangement is advantageous in eliminating the necessity of elaborate adjustment but disadvantageously it requires a multiplexer as an external circuit element. Therefore, the users have to control both multiplexers—an external multiplexer and an internal multiplexer of the single-chip microcomputer. As a result, the selection of a target analog signal becomes complicated. It is difficult to reduce the production costs of a single-chip microcomputer-based equipment.

SUMMARY OF THE INVENTION

The present invention is directed to solve the problems discussed above, and it is a principal object of the present invention to provide a multiplexer which can output a signal inputted to a selected signal terminal to other signal terminal.

According to one aspect of the present invention, there is provided a multiplexer comprises a plurality of first signal terminals; a second signal terminal; a third signal terminal; a plurality of first switching divisions for selecting a signal terminal from the first signal terminals, each switching division having a first terminal connected to each of the first signal terminals and a second terminal; a second switching division having a first terminal connected to the second signal terminal and a second terminal connected to the second terminal of each of the first switching divisions; a third switching division having a first terminal connected to the third signal terminal; and a fourth switching division interposed between the second terminal of each of the first and second switching divisions, and the second terminal of the third switching division, wherein the fourth switching division is opened in response to the closing of the second and third switching divisions.

In response to the closing of the fourth switching division, any one of the first, second or third switching division is closed, thereby selecting a signal from the signal terminal connected to the closed switching division. When the fourth switching division is opened, the second and third switching divisions, and any one of the first switching divisions are closed. In this way the signal terminal connected to the closed first switching division and the signal terminal connected to the second switching division are short-circuited. Then the signal terminal connected to the second and third switching divisions is selected as a connecting terminal for a desired circuit.

According to another aspect of the present invention, there is provided a multiplexer comprises a plurality of first signal terminals; a second signal terminal; a plurality of circuit blocks each of which comprises; a plurality of first switching divisions for selecting a signal terminal from the first signal terminals, each of the first switching divisions having a first terminal connected to each of the first signal terminals; a second switching division having a first terminal connected to the second signal terminal and a second terminal connected to each of the second terminals of the first switching divisions; and a third switching division having a first terminal connected to the second terminal of each of the first and second switching divisions, and being opened in response to the closing of the second switching division; a third signal terminal; a fourth switching division having a first terminal connected to the third signal terminal and a second terminal connected to the second terminal of the third switching division in one of the circuit blocks, wherein the third switching division in the same circuit block has the first terminal connected to the second terminal of the third switching division in one of the other circuit blocks; wherein the fourth switching division is closed in response to the opening of the third switching division in the first-mentioned circuit block.

For example, suppose that there are a first circuit block and a second circuit block, and that the first block is connected to the fourth switching division and the second circuit block connected to the first circuit block. In this situation, when the third switching division in the second circuit block is closed, either the first switching division or the second switching division in the second circuit block is closed. In this way the signal terminal connected to the closed switching division is selected as a connecting terminal for the third switching division in the first circuit block.

When the third switching division is closed in the first circuit block, either the first switching division or the second switching division in the first circuit block is closed. In this way, a signal terminal connected to the closed switching division is selected as a connecting terminal for a desired circuit. When the third switching division in one circuit block is opened, the second switching division in the same circuit block is closed, and if any one of the first switching divisions in the same circuit block is closed, a signal terminal connected to the closed first switching division and the signal terminal connected to the second switching division are short-circuited. At this stage, if the fourth switching division is closed, the signal terminal connected to the fourth switching division is selected as a connecting terminal for a desired circuit.

In this way, any one of the signal terminals in all the circuit blocks is alternatively selected. A signal inputted to any signal terminal in each of the circuit blocks can be outputted to other signal terminal in the same circuit block.

According to a further aspect of the present invention, there is a multiplexer comprises a plurality of first signal terminals; a second signal terminal; a plurality of circuit blocks each of which comprises; a plurality of first switching divisions for selecting a signal terminals from the first signal terminals, each of the first switching divisions having a first terminal connected to each of the first signal terminals; a second switching division having a first terminal connected to the second signal terminal and a second terminal connected to the second terminal of each of the first switching divisions; and a third switching division having a first terminal connected to the second terminal of each of the first and second switching divisions, and being opened in response to the closing of the second switching division; a third signal terminal; a fourth switching division having a first terminal connected to the third signal terminal and a second terminal connected to each of the second terminals of the third switching divisions, wherein the fourth switching division is closed in response to the opening of the third switching divisions in all the circuit blocks.

When the fourth switching division in one circuit block is closed, either the first switching division or the second switching division in the same circuit block is closed. The signal terminal connected to the closed switching division is selected as a connecting terminal for a desired circuit. If the third switching division in one of the circuit blocks is opened, the second switching division is closed. If the third switching divisions in all of the circuit blocks is opened, the fourth switching division is closed. When any one of the first switching division in the circuit block is closed, the signal terminal connected to the closed first switching division and the signal terminal connected to the second switching terminal are short-circuited, and the signal terminal connected to the fourth switching division is selected as a connecting terminal for a desired circuit.

In this way, any one of the signal terminal in all the circuit blocks is alternatively selected. The signal inputted to the selected signal terminal in each circuit block can be inputted to the other signal terminal in the same circuit block.

The above and further objects and features of the present invention will more fully be apparent from the following detailed description with accompanying drawings:

DESCRIPTION OF THE PREFERRED EMBODIMENTS

Hereinafter, the invention will be described in detail with reference to the drawings showing its embodiments.

Figure 1:
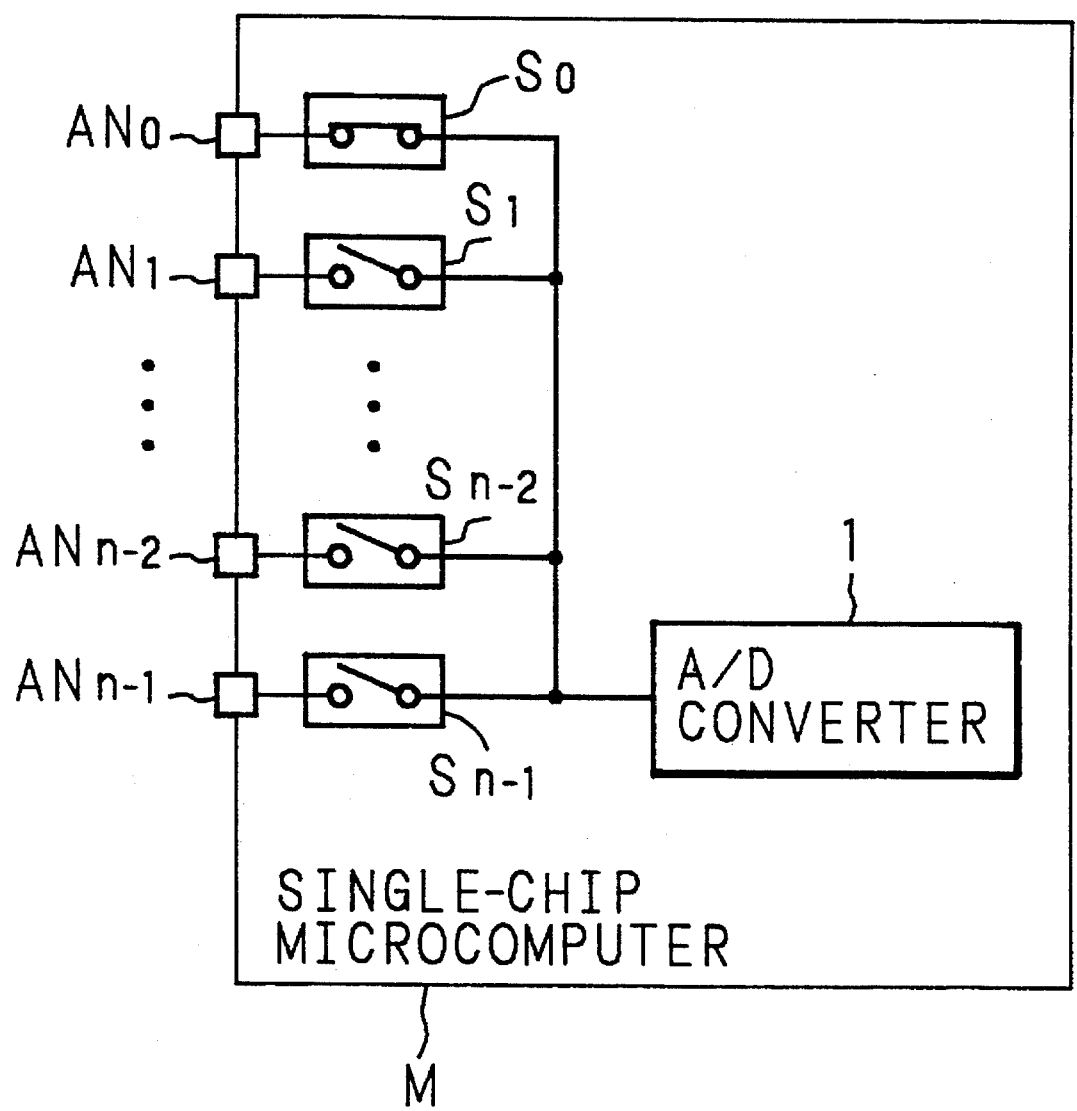
FIG. 1 is a diagram showing the structure of a known single-chip microcomputer having a conventional built-in multiplexer.
Figure 2:
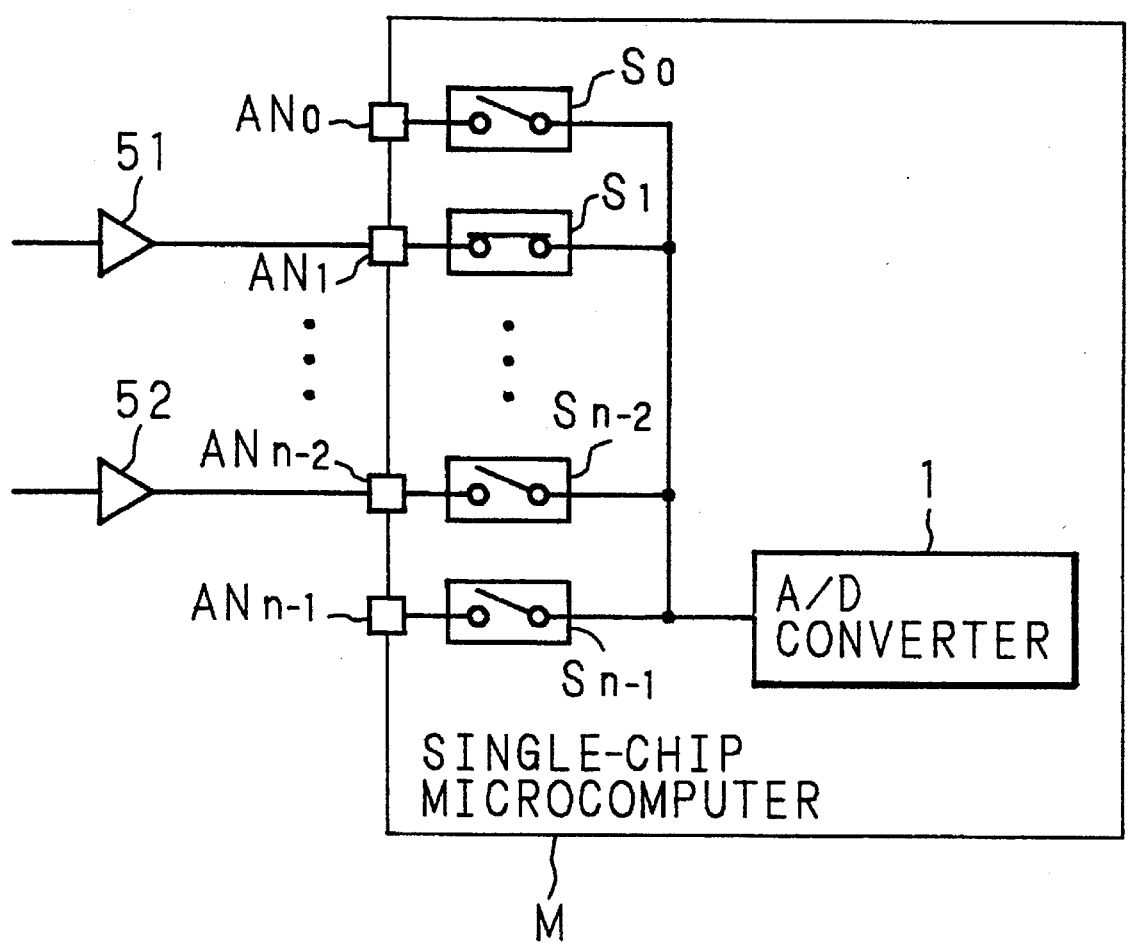
FIG. 2 is a diagram showing an example of the structure of a known microcomputer.
Figure 3:
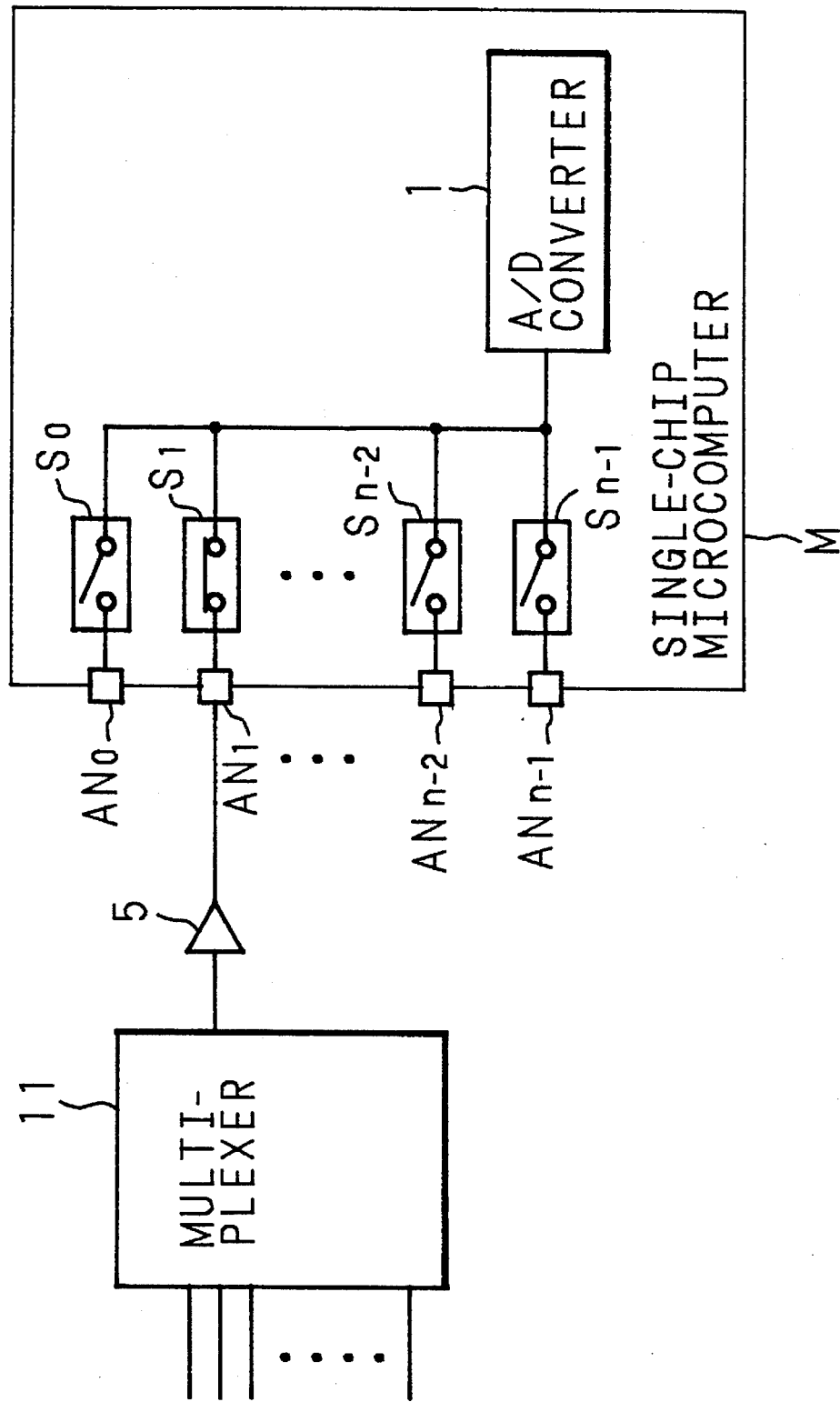
FIG. 3 is a diagram showing another example of the structure of a known microcomputer.
Figure 4:
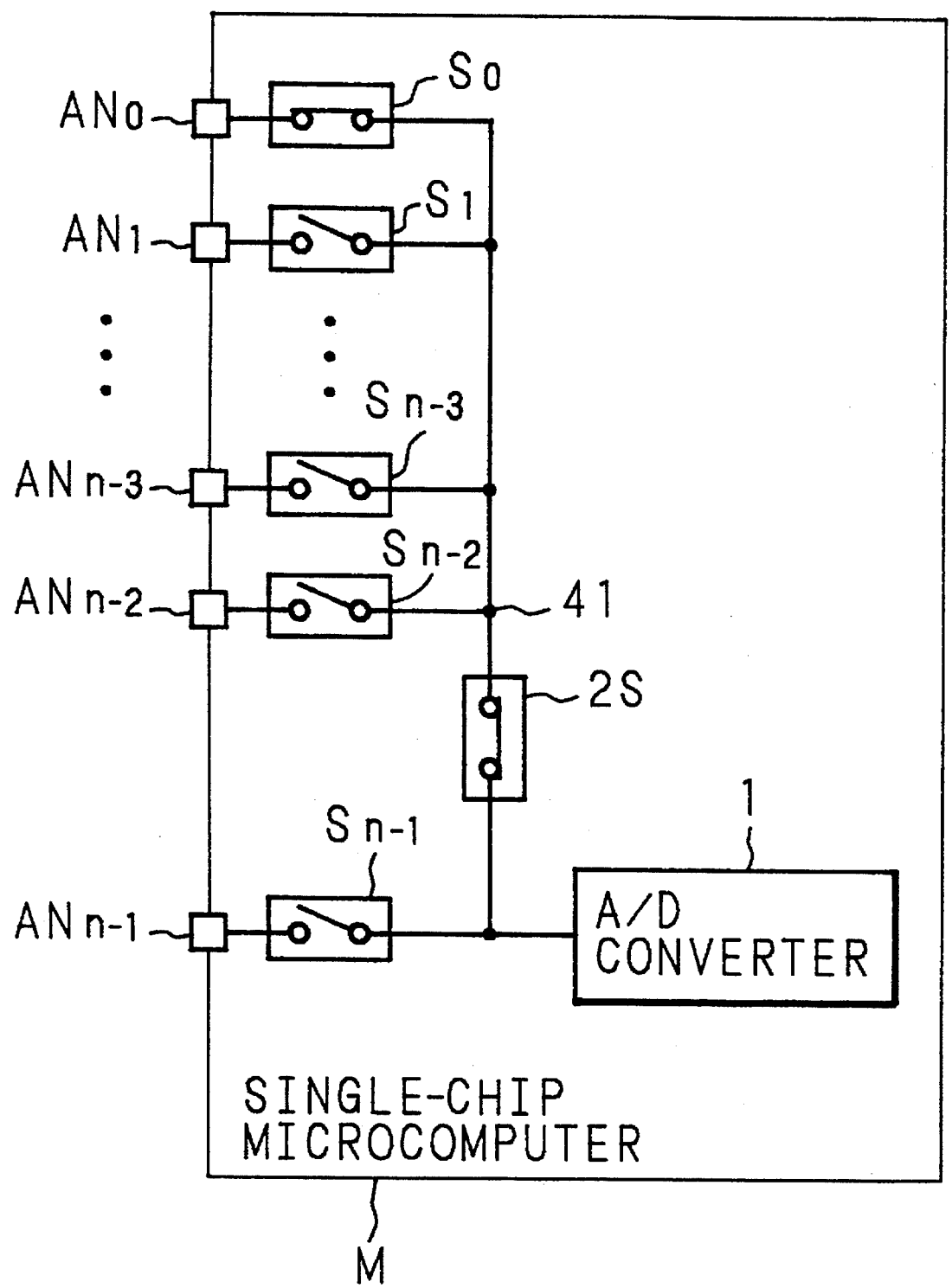
FIG. 4 is a diagram showing the structure of a single-chip microcomputer having a built-in multiplexer according to the present invention.

Referring to FIG. 4, a single-chip microcomputer M (hereinafter referred to a "microcomputer M") is provided with signal terminals $AN_0$, $AN_1$ . . . $AN_{n-3}$, $AN_{n-2}$ and $AN_{n-1}$ through which signals are inputted and outputted. The signal terminal $AN_1$ is connected to one of the terminals of a switching element $S_0$ as a first division. Likewise, the signal terminals $AN_1$ to $AN_{n-3}$ are respectively connected to one of the terminals of the switching elements $S_1$ to $S_{n-3}$ as first division. The signal terminal $AN_{n-2}$ is connected to one of the terminals of a switching element $S_{n-2}$ as a second division. The terminal $AN_{n-1}$ is connected to one of the terminals of a switching element $S_{n-1}$ as a third division. The other terminals of the switching elements $S_0$ to $S_{n-2}$ are connected to a common node 41 which is connected to one of the terminals of a fourth switching element 2S as a fourth division. The other terminals of the fourth switching element 2S and of the switching element $S_{n-1}$ are connected to each other and jointly connected to the input terminal of an A/D converter 1. The switching elements $S_0$ to $S_{n-1}$ and 2S constitute a multiplexer which is controlled such that the opening of the switching element 2S closes the switching elements $S_{n-2}$ and $S_{n-1}$.

Figure 5:
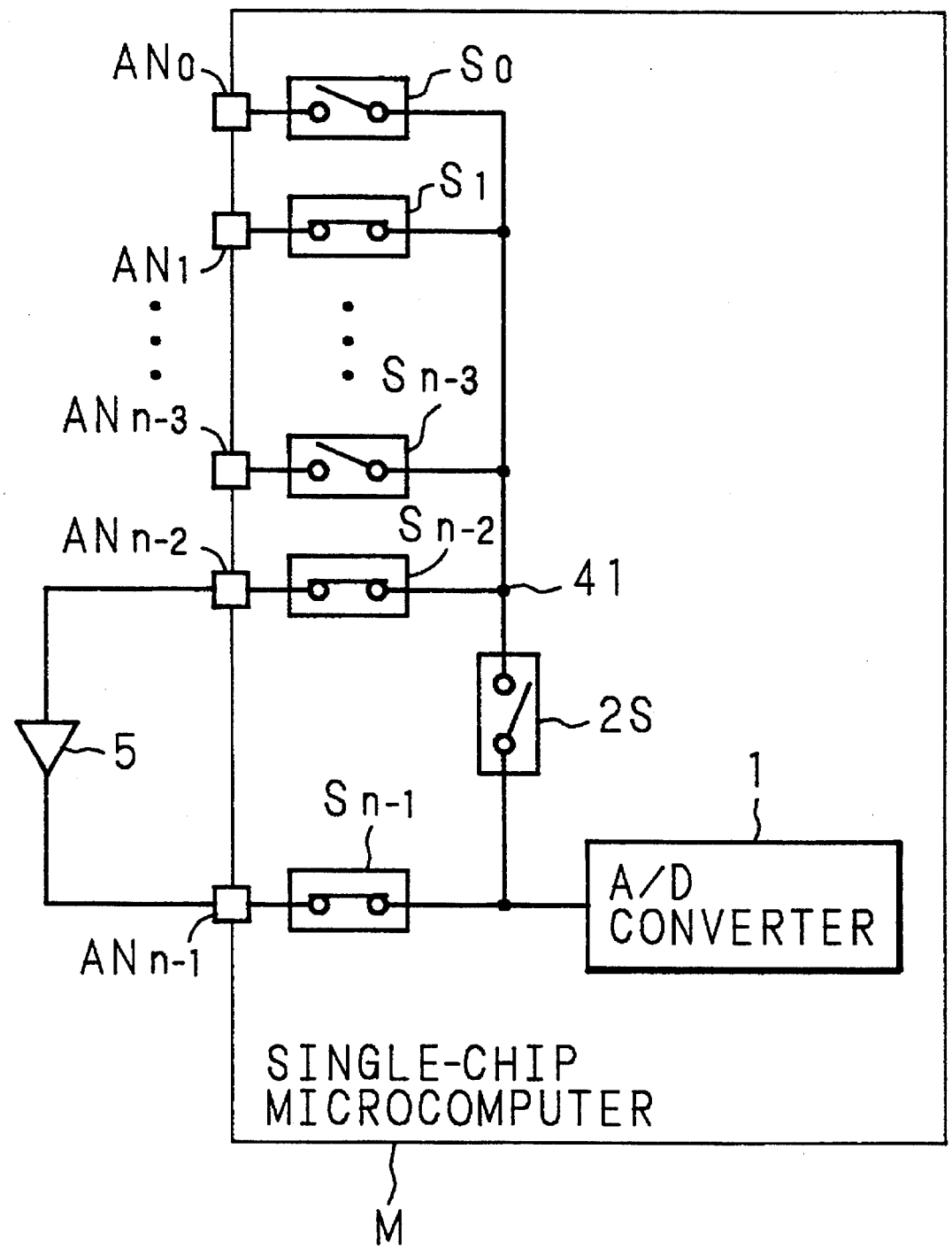
FIG. 5 is a block diagram showing an example of the structure of the microcomputer of FIG. 4.

Referring to FIG. 5, the way of using the microcomputer M having such a built-in multiplexer will be described.

If an analog signal to be inputted to the microcomputer M has a smaller amplitude than an optimum value prescribed in the A/D converter, an analog amplifier 5 is interposed between the signal terminals $AN_{n-2}$ and $AN_{n-1}$ as shown in FIG. 5. In this situation, the signal terminals $AN_0$ to $AN_{n-3}$, and $AN_{n-1}$ are input terminals and the signal terminal $AN_{n-2}$ is an output terminal.

For example, if an analog signal having a smaller amplitude than the optimum value is inputted to the signal terminal $AN_1$, the switching element 2S is opened, followed by the closing of the switching elements $S_{n-2}$ and $S_{n-1}$. When the switching element $S_1$ is closed, the analog signal at the signal terminal $AN_1$ is outputted to the signal terminal $AN_{n-2}$ through the switching elements $S_1$ and $S_{n-2}$, and inputted to the analog amplifier 5 whereby its amplitude is amplified to reach the optimum value. The amplified analog signal is inputted to the signal terminal $AN_{n-1}$ and inputted to the A/D converter 1 through the switching element $S_{n-1}$. In this way, the precision of the A/D conversion is secured.

If an analog signal having an equal amplitude to the optimum value is to be inputted to any terminal, for example, the terminal $AN_0$, the switching element 2S is closed, and the switching element $S_{n-1}$ is opened. At this stage, one of the switching elements $S_0$, $S_1$ to $S_{n-3}$, for example, the switching element $S_0$ is closed. The analog signal inputted to the signal terminal $AN_0$ is inputted to the A/D converter 1 through the switching elements $S_0$ and 2S. In this way, the analog signal is converted into a digital signal with high precision.

As is evident from the foregoing description, a single analog amplifier 5 connected externally to the microcomputer M enables analog signals to be smoothly inputted to the microcomputer M even in case of the amplitudes having a smaller or equal value as compared to the optimum value for the A/D converter 1. In this way the number of analog amplifiers to be connected to the microcomputer can be minimized, and the troublesome adjustment of the amplitudes of the analog amplifiers can be save. The analog signal can be selected by opening and closing the switching elements $S_1$ to $S_{n-1}$ and 2S, so that opening and closing the switching elements can be easily controlled and the analog signal can be easily selected.

In manufacturing the microcomputers the A/D converter and multiplexers are necessarily tested. One of the testing method is to input an analog signal to the signal terminal $AN_0$ so as to input the same to the A/D converter 1 through the switching element 2S. The performance of the A/D converter can be examined through the result of A/D conversion. In examining the multiplexer, one example is that the switching element 2S is opened and the switching elements $S_0$ and $S_1$ are closed when an analog signal is inputted to the signal terminal $AN_0$ from which an analog signal is outputted to the signal terminal $AN_1$. The performance of the multiplexer is examined by comparing the amplitudes of the two analog signals inputted and outputted. The testing of the multiplexer requires no process of A/D conversion by the A/D converter, thereby shortening a period of time for testing the multiplexer. The testing can be finished in a relatively short time with respect to the A/D converter and multiplexer.

Figure 6:
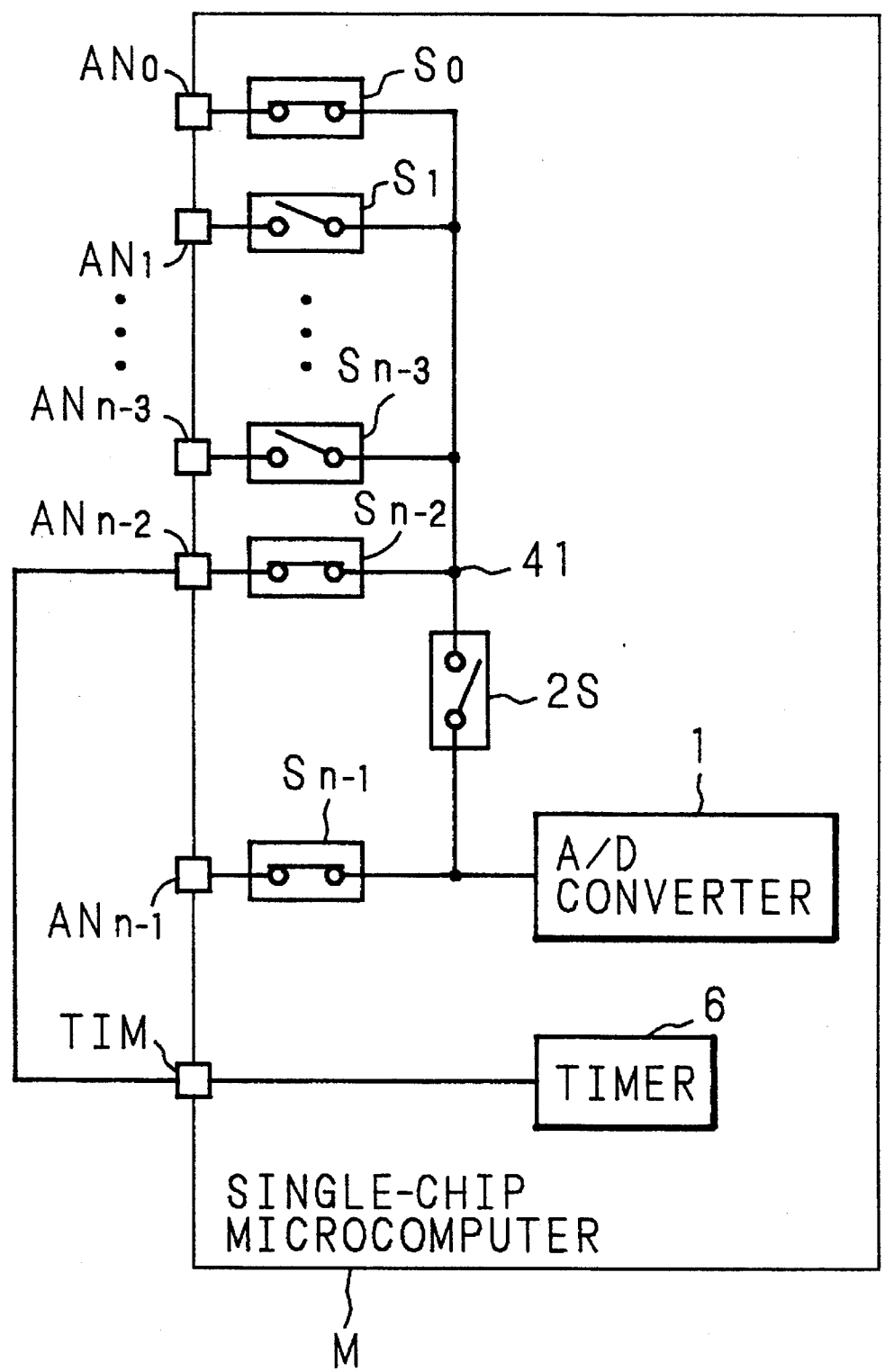
FIG. 6 is a block diagram showing another example of the structure of the microcomputer of FIG. 4.

Referring to FIG. 6, wherein like reference numerals designate like elements and components to those in FIG. 4, another example of the microcomputer equipped with the multiplexer according to the present invention will be described:

The microcomputer M is provided with a timer signal terminal TIM which is connected to a built-in timer 6 of the microcomputer M. Since the structure of the microcomputer M other than this is same as that of the microcomputer shown in FIG. 4. This type of microcomputer M is used when the analog signal inputted to the A/D converter 1 is a single.

The microcomputer M of this example is used as follows:

As shown in FIG. 6, the signal terminal $AN_{n-2}$ and the timer signal terminal TIM are connected to each other outside the microcomputer M where the switching element 2S is constantly opened and the switching elements $S_{n-2}$ and $S_{n-1}$ are constantly closed. At this stage, if an analog signal is inputted to the signal terminal $AN_{n-1}$, the resultant analog signal is constantly inputted to the A/D converter 1 through the switching element $S_{n-1}$ and the A/D conversion is conducted. In this way the analog signal is converted into a digital signal. The switching elements $S_0$, $S_1$ to $S_{n-3}$ and $S_{n-2}$ functions as a multiplexer which selects a digital signal to be inputted to the timer 6. More specifically, the switching element $S_{n-2}$ is constantly closed, and any one of the switching elements $S_0$ to $S_{n-3}$ corresponding to the signal terminals $AN_0$ to $AN_{n-3}$ is closed. This state enables different digital signals inputted to the signal terminals $AN_0$ to $AN_{n-3}$ to be alternatively selected and inputted to the timer signal terminal TIM. The digital signal is inputted to the timer 6 which counts the number of pulses of the inputted digital signal to measure a period of time for which the counted value reaches a predetermined value.

This example of the embodiment is advantageous in that owing to the timer 6, the number of channels for digital signals counted by the timer 6 is increased only with the use of a signal terminal not used for the A/D converter 1 but without the addition of a new circuit outside the microcomputer M, thereby widening the scope of applications for the microcomputers.

Figure 7:
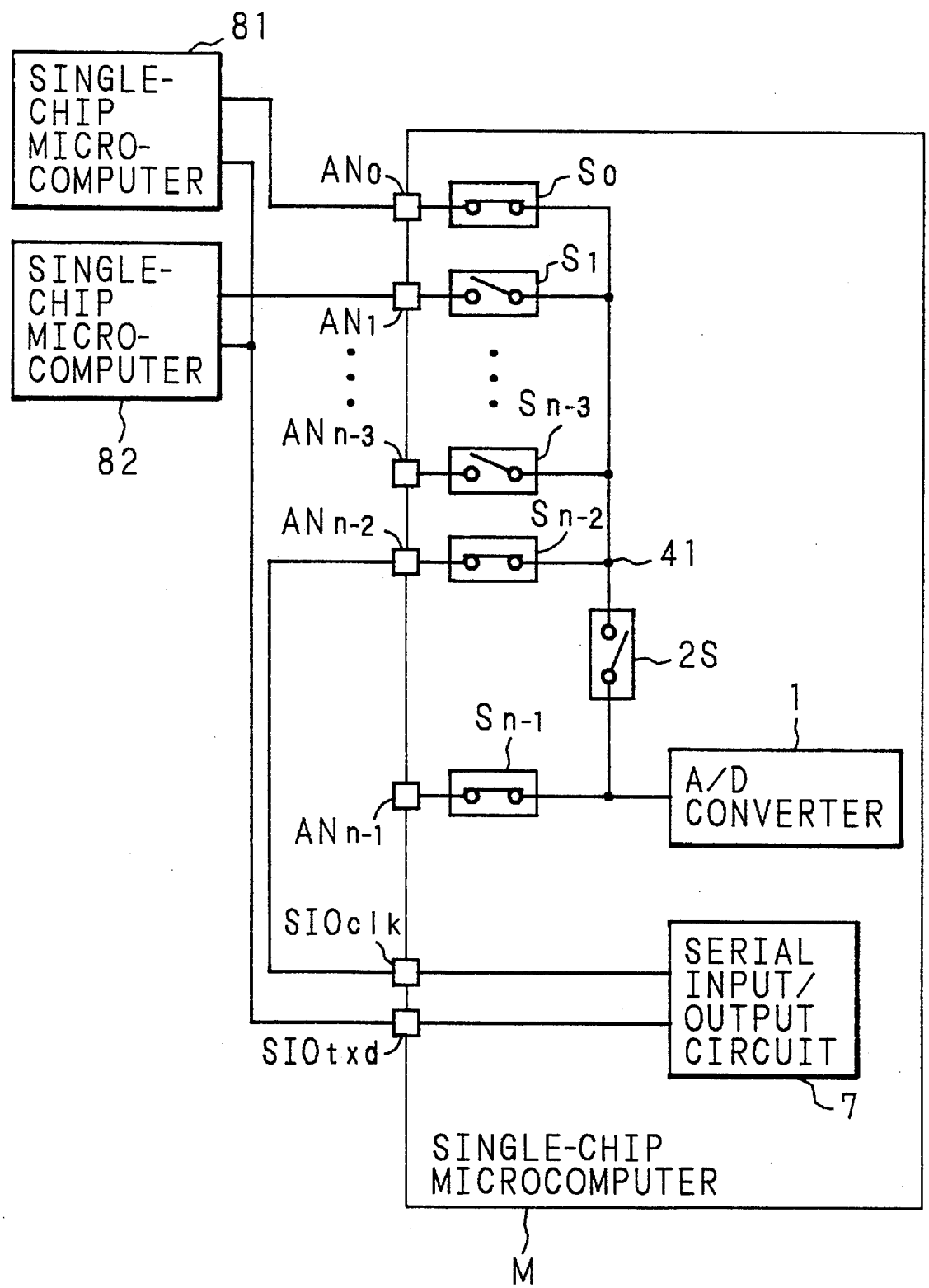
FIG. 7 is a block diagram showing a further example of the structure of the microcomputer of FIG. 4.

Referring to FIG. 7, wherein like reference numerals designate like reference elements and components to those in FIG. 4, the microcomputer M is provided with a serial clock terminal $SIO_{clk}$ and a serial data terminal $SIO_{txd}$ which are connected to a serial input/output circuit 7 at the clock output terminal and at the serial data terminals, respectively. In this example, too, an analog signal to be inputted to the A/D converter 1 is a single.

The microcomputer M is used as follows:

The microcomputer M is connected to external single-chip microcomputers 81 and 82 through the signal terminals $AN_0$ and $AN_1$ so as to transmit data from the microcomputer M to each external microcomputer 81 or 82. The serial clock terminal $SIO_{clk}$ and the signal terminal $AN_{n-2}$ are connected to each other at the outside. The serial data terminal $SIO_{txd}$ is connected to the external microcomputers 81 and 82 at their respective input terminals. In this case, the signal terminals $AN_{n-2}$ and $AN_{n-1}$ function as signal input terminals, and the signal terminals $AN_0$ and $AN_1$ to $AN_{n-3}$, the serial clock terminal $SIO_{clk}$ and the serial data terminal $SIO_{txd}$ function as signal output terminals.

The switching element 2S is opened, and the switching elements $S_{n-2}$ and $S_{n-1}$ are both closed. The switching element $S_0$ is also closed. In this way the serial input/output circuit 7 outputs a serial clock to the microcomputer 81 which samples and holds data from the serial data terminal $SIO_{txd}$ in synchronism with the inputted serial clock. While the transmission of the serial clock is suspended (i.e. the electrical potential is fixed), the sampling of the data from the serial data terminal $SIO_{txd}$ is also suspended.

The serial clock is outputted by constantly opening the switching element 2S, constantly closing the switching element $S_{n-2}$, and closing any one of the switching elements $S_0$ and $S_1$ to $S_{n-3}$ corresponding to the signal terminals $AN_0$ and $AN_1$ to $AN_{n-3}$. In this way a multiplexer is constituted by the signal terminals not used for the A/D converter 1, and a serial clock is selectively supplied either to the external microcomputers 81, 82 or the signal terminal $AN_{n-3}$. According to this example, the number of microcomputers M can be increased which receive data outputted from the serial input/output circuit 7 without adding an extra circuit outside the microcomputer M, thereby enabling the microcomputers M to find a wide range of applications.

Figure 8:
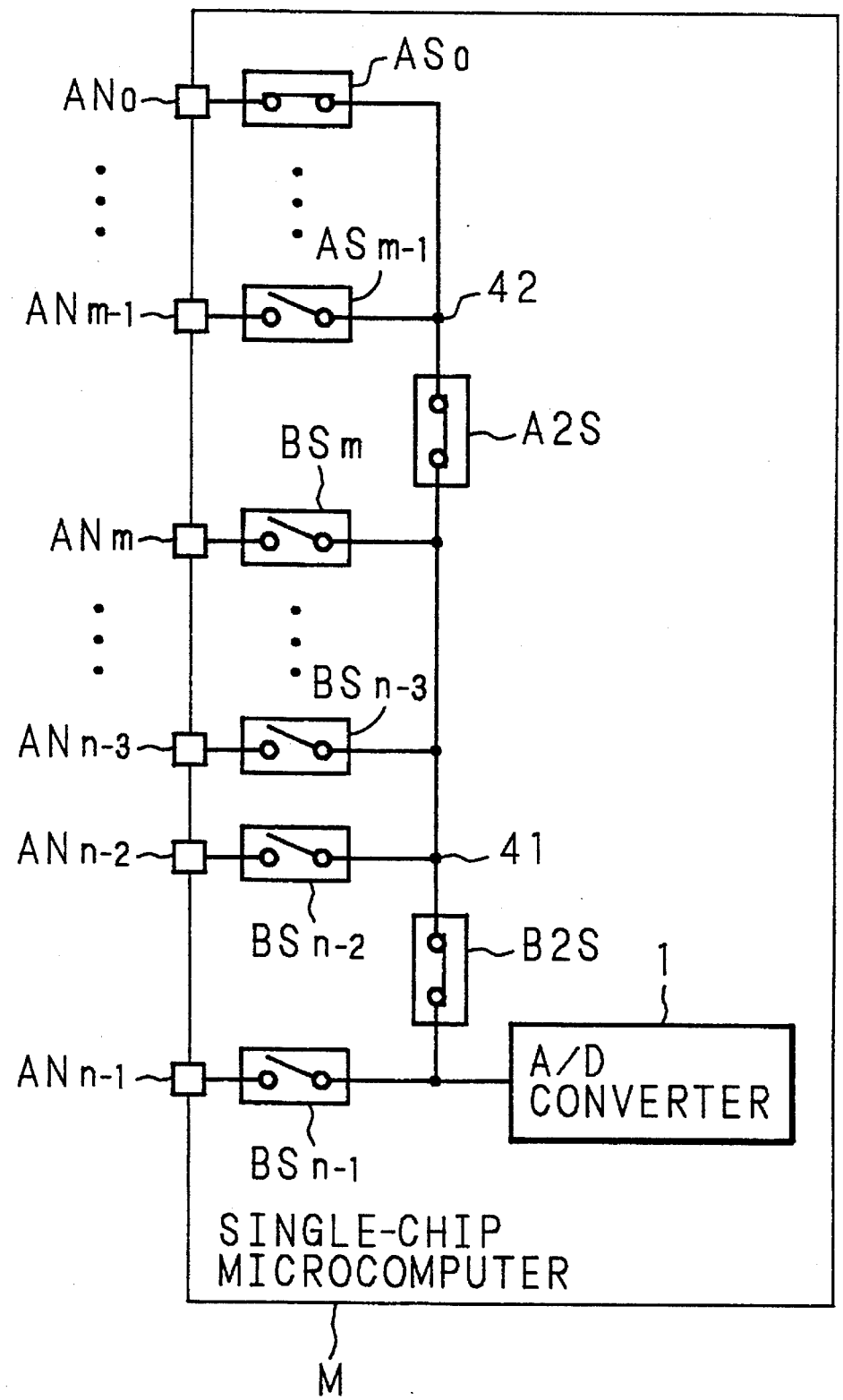
FIG. 8 is a diagram showing the structure of a single-chip microcomputer having a modified version of built-in multiplexer according to the present invention.

Referring to FIG. 8, the microcomputer M is equipped with a first group of signal terminals consisting of a plurality of signal terminals $AN_0$ . . . plus a single signal terminal $AN_{m-1}$ and a second group of signal terminals consisting of a plurality of signal terminals $AN_m$ to $AN_{n-2}$ . . . plus two single signal terminals $AN_{n-2}$ and $AN_{n-1}$. The signal terminals $AN_0$ . . . are connected to one of the terminals of switching elements $AS_0$ . . . as a first division, and the signal terminal $AN_{m-1}$ is connected to one of the terminals of a switching element $AS_{m-1}$ as a second division.

Further, signal terminals $AN_m$ . . . and $AN_{n-3}$ are connected to one of the terminals of switching elements $BS_m$ . . . $BS_{n-3}$ as a first division, and the signal terminal $AN_{n-2}$ is connected to one of the terminals of a switching element $BS_{n-2}$ as a second division. The signal terminal $AN_{n-1}$ is connected to one of the terminals of a switching element $BS_{n-1}$ as a fourth division.

The other terminals of the switching elements $AS_0$ to $AS_{m-1}$ are connected to a node 42, and the other terminals of the switching elements $BS_m$ to $BS_{n-3}$ and $BS_{n-2}$ are connected to a node 41. A switching element A2S as a third division is interposed between the nodes 41 and 42. The other terminal of the switching element $BS_{n-1}$ is connected to the node 41 through the switching element B2S as a third division, which means that the switching element $BS_{n-1}$ is directly connected to the A/D converter 1 at the input terminal. It is controlled such that when the switching element A2S is opened, the switching element $AS_{m-1}$ is closed, and when the switching element B2S is opened, the switching element $BS_{n-2}$ is closed.

The signal terminal $AN_0$ ... and $AN_{m-1}$, the switching elements $AS_0$ ... and $AS_{m-1}$, and the switching element A2S constitute a circuit block, and the signal terminal $AN_m$ ... and $AN_{n-2}$, the switching elements $BS_m$ ... $BS_{n-2}$, and the switching element B2S constitute another circuit block.

The microcomputer according to this Example is used as follows:

FIG. 8 shows a case where an analog signal having an amplitude close to an optimum one prescribed by the A/D converter 1 is inputted to the signal terminal $AN_0$. At this stage, when the switching elements $AS_0$, A2S and B2S are closed, the analog signal inputted to the signal terminal $AN_0$ is inputted to the A/D converter 1, thereby enabling the analog signal to be converted into a digital signal with high precision.

Figure 9:
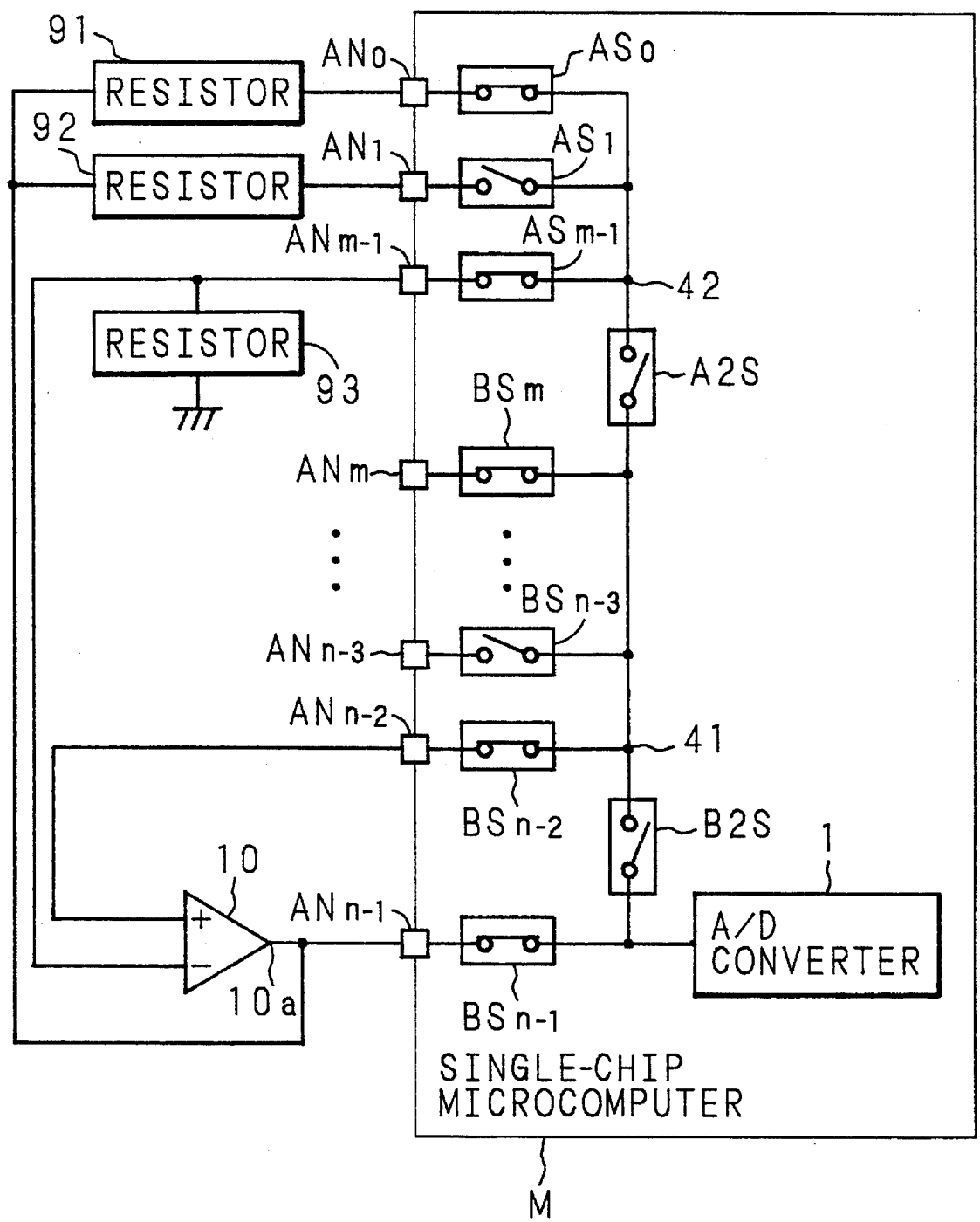
FIG. 9 is a block diagram showing an example of the structure of the microcomputer of FIG. 8.

If the amplitude of an analog signal to be converted in the A/D converter is smaller than the optimum one prescribed by the A/D converter where the amplitudes of an analog amplifier are changed in accordance with each analog signal, the circuit is preferably constructed as shown in FIG. 9.

Now, referring to FIG. 9, the microcomputer M is externally equipped with resistors 91, 92 and 93 for setting an amplitude and an operational amplifier 10.

The signal terminal $AN_0$ is connected to an output terminal 10a of the operational amplifier 10 through the resistor 91, and the signal terminal $AN_1$ is connected to the output terminal 10a of the operational amplifier 10 through the resistor 92. The output terminal 10a of the operational amplifier 10 is connected to the signal terminal $AN_{n-1}$. The signal terminal $AN_{m-1}$ is grounded through the resistor 93, and is directly connected to an inverting input terminal (−) of the operational amplifier 10, and the signal terminal $AN_{n-2}$ is connected to a non-inverting input terminal (+) of the operational amplifier 10. In this case, the signal terminals $AN_0$, $AN_1$, $AN_m$ ... , $AN_{n-3}$ and $AN_{n-1}$ function as input terminals, and the signal terminals $AN_{m-1}$, and $AN_{n-2}$ function as output terminals. In this way, operational amplifier 10 and the resistors 91, 92 and 93 for setting an amplitude constitute a non-inverting amplifier which constitutes an analog amplifier.

When the amplitude of an analog signal inputted to the signal terminal $AN_m$ is below the optimum value, the switching elements A2S and B2S are opened, which is followed by the closing of the switching elements $AS_{m-1}$ and $BS_{n-2}$, and the closing of the switching elements $AS_0$ and $BS_m$. An analog signal inputted to the signal terminal $AN_m$ is outputted to the signal terminal $AN_{n-2}$ through the switching elements $BS_m$ and $BS_{n-2}$, and inputted to the non-inverting input terminal (+) of the operational amplifier 10. The analog signal is amplified by the operational amplifier 10 and the resistors 91 and 93, which constitute a non-inverting amplifier, until it has an optimum amplitude prescribed by the A/D converter 1. Then the analog signal is inputted to the A/D converter 1 through the signal terminal $AN_{n-1}$, thereby enabling the analog signal have an A/D conversion with high precision.

The degree of amplitudes of the non-inverting amplifier is adjustable in accordance with the resistance ratio of the resistors 91 and 93. In order to change the degree of amplitude, the switching element $AS_0$ is opened and the switching element $AS_1$ is closed, thereby constituting a non-inverting amplifier by the operational amplifier 10 and the amplitude setting resistors 92 and 93. When the amplitude of an analog signal is optimum where it can be directly inputted to the A/D converter 1 without passing the operational amplifier 10, the switching element B2S is closed, and the switching element $BS_{n-1}$ is opened. Thus the analog signal is inputted to the A/D converter 1 without being amplified.

While it is not necessary to change the degree of amplitude, the signal terminals $AN_0$, $AN_1$ and $AN_{m-1}$ are not used. At this stage, if the switching element A2S is closed, these signal terminals can be used as a multiplexer which alternatively selects an analog signal to be inputted to any one of the signal terminals $AN_0$, $AN_1$, $AN_{m-1}$, $AN_m$ ... and $AN_{n-3}$.

As shown in FIG. 9, when the microcomputer is used, there may be cases where a plurality of analog signals having different amplitudes are inputted. According to the present invention, it suffices to provide the microcomputer M with a single external analog amplifier. This is advantageous over the conventional microcomputers which require several amplifiers. The selection of an analog signal and the adjustment of amplitude through the amplifier are achieved by opening and closing the switching elements $AS_0$, $AS_1$, $AS_{m-1}$, A2S and B2S. Thus the control procedure is simplified.

Figure 10:
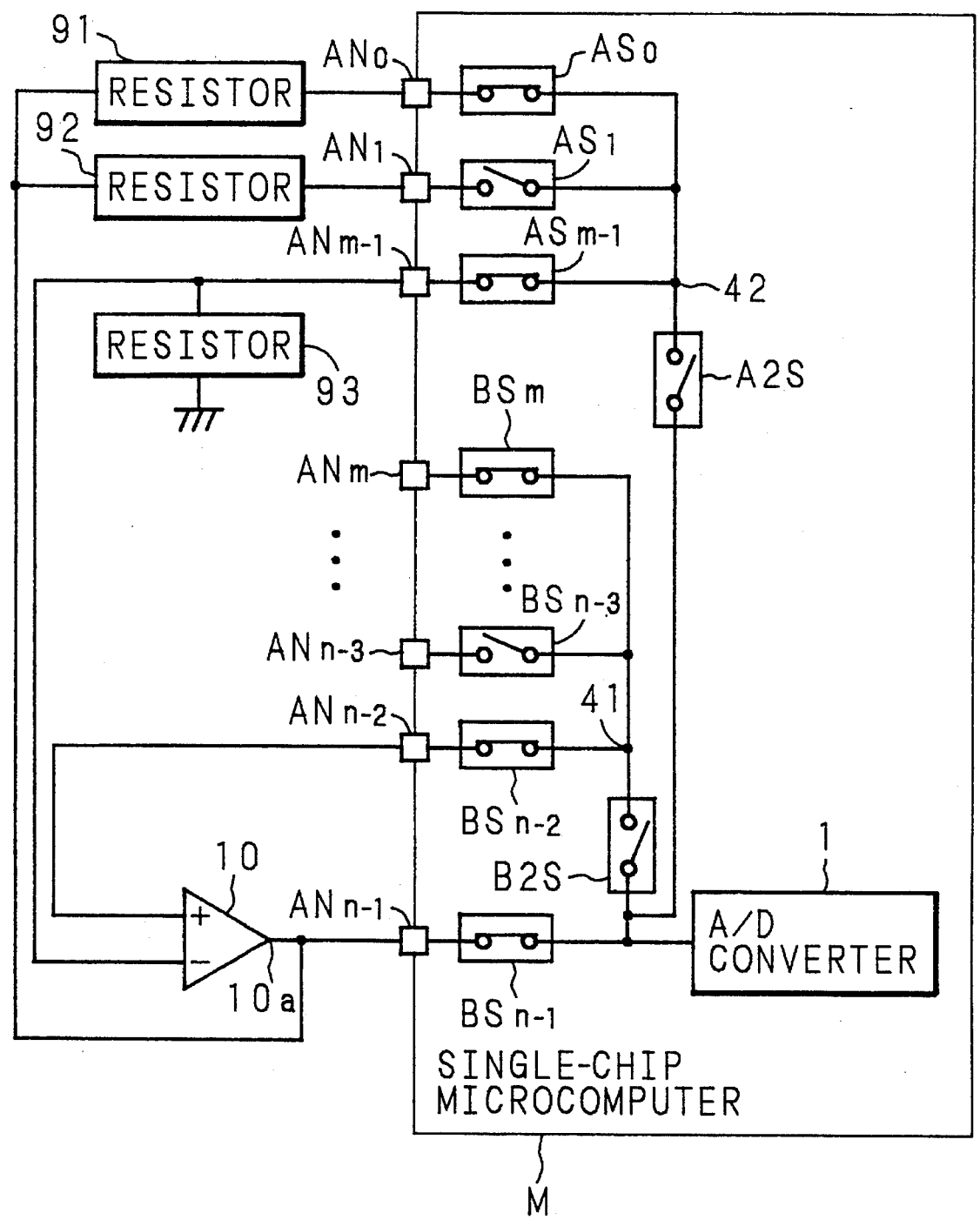
FIG. 10 is a diagram showing the structure of a single-chip microcomputer having a further modified version of built-in multiplexer according to the present invention.

In FIG. 9 the nodes 41 and 42 are connected to each other through the switching element A2S, but the node 42 can be connected to a middle point among the switching elements $BS_{n-1}$, B2S and the A/D converter 1 through the switching element A2S. This constitute a multiplexer as shown in FIG. 10, wherein like reference numerals designate like reference elements and components to those in FIG. 9 and the description is omitted. It is also possible to connect a circuit block of the switching elements $AS_0$ ... $AS_{m-1}$, A2S and a circuit block of the switching elements $BS_m$ ... $BS_{n-3}$, $BS_{n-2}$ and B2S in parallel where the same effect can be obtained. In this case, when both switching elements A2S and B2S are opened, the switching element $BS_{n-1}$ is opened.

In the foregoing description, the multiplexer is built in the microcomputer but the embodiment is not limited to it.

In the illustrated examples an analog signal is selected by the multiplexer and inputted to the A/D converter but the present invention can be applied when an analog signal is inputted to an amplifier or a control circuit and the same effect can be obtained.

According to the multiplexer of the present invention, a single signal is selected by alternatively selecting any one of a plurality of signal terminals and the selected signal can be outputted to other signal terminal. The performance of the multiplexer can be tested for a short period of time without operating the circuit of a device to which the signal selected by the multiplexer is transmitted, thereby shortening the testing period of time of the performance in the multiplexer and the circuit to which the signal is transmitted. When the multiplexer of the present invention is built in a single-chip microcomputer, the number of external devices such as amplifiers to be installed outside the single-chip can be reduced, thereby decreasing the cost born by user. The less external circuits to be installed lead to simplicity in the adjustment and maintenance. This is also conductive to the reduction of cost.

Further, the multiplexer of the invention allows more signals to be inputted thereto and outputted therefrom, which means that the number of channels for signals is increased. As a result, the multiplexer can find many more applications.

As this invention may be embodied in several forms without departing from the spirit of essential characteristics thereof, the examples of embodiment are therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. A multiplexer for alternatively selecting a plurality of signals, the multiplexer comprising:
   a plurality of first signal terminals;
   a second signal terminal;
   a third signal terminal;
   a plurality of first switching divisions for selecting a signal terminal from the first signal terminals, each of the first switching divisions having a first terminal connected to each of the first signal terminals and a second terminal;
   a second switching division having a first terminal connected to the second signal terminal and a second terminal connected to the second terminal of each of the first switching divisions;
   a third switching division having a first terminal connected to the third signal terminal and a second terminal; and
   a fourth switching division interposed between the second terminal of each of the first and second switching divisions, and the second terminal of the third switching division;
   wherein the fourth switching division is opened in response to the closing of the second and third switching divisions.

2. The multiplexer according to claim 1, wherein a signal inputted through the first signal terminal alternatively selected by the first switching divisions is outputted outside the multiplexer from the second signal terminal and again inputted through the third signal terminal, in response to the opening of the fourth switching division.

3. The multiplexer according to claim 1, further comprising a fourth signal terminal, wherein a signal inputted through the first signal terminal alternatively selected by the first switching divisions is outputted outside the multiplexer from the second signal terminal and again inputted through the fourth signal terminal, in response to the opening of the fourth switching division.

4. The multiplexer according to claim 1, wherein the multiplexer is connected to a plurality of external devices connected to each of the first signal terminals, and additionally provided with a fourth signal terminal, wherein a signal is outputted outside the multiplexer from the fourth signal terminal and after being again inputted through the second signal terminal, it is outputted to the external device connected to the first signal terminal alternatively selected by the first switching division in response to the opening of the fourth switching division.

5. A multiplexer for alternatively selecting a plurality of signals, the multiplexer comprising:
   a plurality of circuit blocks each of which comprises;
      a plurality of first signal terminals;
      a second signal terminal;
      a plurality of first switching divisions for selecting a signal terminal from the first signal terminals, each of the first switching divisions having a first terminal connected to each of the first signal terminals and a second terminal;
      a second switching division having a first terminal connected to the second signal terminal and a second terminal connected to each of the second terminals of the first switching divisions; and
      a third switching division having a first terminal connected to the second terminal of each of the first and second switching divisions, and being opened in response to the closing of the second switching division;
   a third signal terminal; and
   a fourth switching division having a first terminal connected to the third signal terminal and a second terminal connected to the second terminal of the third switching division in one of the circuit blocks, wherein the third switching division in the same circuit block has the first terminal connected to the second terminal of the third switching division in one of the other circuit blocks;
   wherein the fourth switching division is closed in response to the opening of the third switching division in the first-mentioned circuit block.

6. The multiplexer according to claim 5, wherein the number of the circuit blocks is two.

7. A multiplexer for alternatively selecting a plurality of signals, the multiplexer comprising:
   a plurality of circuit blocks each of which comprises:
      a plurality of first signal terminals;
      a second signal terminal;
      a plurality of first switching divisions for selecting a signal terminal from the first signal terminals, each of the first switching divisions having a first terminal connected to each of the first signal terminals and a second terminal;
      a second switching division having a first terminal connected to the second signal terminal and a second terminal connected to the second terminal of each of the first switching divisions; and
      a third switching division having a first terminal connected to the second terminal of each of the first and second switching divisions, and being opened in response to the closing of the second switching division;
   a third signal terminal; and
   a fourth switching division having a first terminal connected to the third signal terminal and a second terminal connected to each of the second terminals of the third switching divisions in a plurality of circuit blocks,
   wherein the fourth switching division is closed in response to the opening of the third switching divisions in all the circuit blocks.

8. The multiplexer according to claim 7, wherein the number of the circuit blocks is two.

* * * * *